(12) United States Patent
Long

(10) Patent No.: US 11,251,203 B2
(45) Date of Patent: Feb. 15, 2022

(54) DEMULTIPLEXER AND ARRAY SUBSTRATE INCLUDING THE SAME, DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 309 days.

(21) Appl. No.: 16/607,575

(22) PCT Filed: Jan. 31, 2019

(86) PCT No.: PCT/CN2019/074093
§ 371 (c)(1),
(2) Date: Oct. 23, 2019

(87) PCT Pub. No.: WO2019/210724
PCT Pub. Date: Nov. 7, 2019

(65) Prior Publication Data
US 2021/0408066 A1    Dec. 30, 2021

(30) Foreign Application Priority Data

May 4, 2018    (CN) .................. 201820659349.X

(51) Int. Cl.
*H01L 27/12*    (2006.01)
*H01L 29/786*   (2006.01)
*H01L 27/02*    (2006.01)

(52) U.S. Cl.
CPC ...... *H01L 27/1222* (2013.01); *H01L 27/0207* (2013.01); *H01L 27/124* (2013.01); *H01L 29/78696* (2013.01)

(58) Field of Classification Search
CPC ..... H01L 27/1222–1233; H01L 27/124–1244; H01L 29/78696;
(Continued)

(56) References Cited

U.S. PATENT DOCUMENTS

2010/0102397 A1    4/2010    Park et al.
2014/0103349 A1    4/2014    Yu et al.

FOREIGN PATENT DOCUMENTS

| CN | 104898340 A | 9/2015 |
|---|---|---|
| CN | 208062051 U | 11/2018 |
| GN | 104898340 A | 9/2015 |

OTHER PUBLICATIONS

First Office Action dated Apr. 28, 2021 for application No. IN201937044813 with English translation attached.

*Primary Examiner* — Amar Mowa
(74) *Attorney, Agent, or Firm* — Nath, Goldberg & Meyer; Joshua B. Goldberg

(57) ABSTRACT

The present disclosure provides a demultiplexer, an array substrate and a display device. The array substrate comprises a plurality of data line leads, a plurality of data lines arranged side by side and the demultiplexer. The demultiplexer includes first to third control gate lines arranged in parallel and first to sixth thin film transistors. The first thin film transistor to the third thin film transistor are positioned at a side of the demultiplexer proximal to the first control gate line, the fourth thin film transistor to the sixth thin film transistor are positioned at a side of the demultiplexer proximal to the third control gate line, and drains of the first thin film transistor to the sixth thin film transistor are respectively coupled to corresponding ones of the plurality of data lines.

20 Claims, 4 Drawing Sheets

(58) Field of Classification Search
CPC ... H01L 27/1237; H01L 27/0207–0211; G02B 6/12007–12033; G03F 7/70208; Y10S 370/916
See application file for complete search history.

A-A

B-B

DEMULTIPLEXER AND ARRAY SUBSTRATE INCLUDING THE SAME, DISPLAY DEVICE

CROSS REFERENCE TO RELATED APPLICATIONS

This is a National Phase Application filed under 35 U.S.C. 371 as a national stage of PCT/CN2019/074093, filed Jan. 31, 2019, claiming priority to Chinese patent application No. 201820659349.X, filed May 4, 2018, each of which is incorporated by reference in its entirety.

TECHNICAL FIELD

The present disclosure relates to the field of display technology, and in particular, to a demultiplexer, an array substrate including the demultiplexer, and a display device.

BACKGROUND

Display devices have been widely used in consumer electronics such as mobile phones, notebook computers, personal computers, and personal digital assistants. Due to a requirement for a narrow bezel of the display device, it is a major challenge to complete wiring of a demultiplexer, data lines and their leads on a display panel with high resolution and a small or medium size.

SUMMARY

The present disclosure provides a demultiplexer including a first thin film transistor to a sixth thin film transistor, the first thin film transistor to the third thin film transistor are located on a same side in the demultiplexer, and the fourth thin film transistor to the sixth thin film transistor are located on another side opposite to the first thin film transistor to the third thin film transistor in the demultiplexer; sources of the first thin film transistor to the third thin film transistor are coupled together to form a first input terminal of the demultiplexer; sources of the fourth thin film transistor to the sixth thin film transistor are coupled together to form a second input terminal of the demultiplexer; drains of the first thin film transistor to the sixth thin film transistor are respectively used as a first output terminal to a sixth output terminal of the demultiplexer; gates of the first thin film transistor and the fifth thin film transistor are coupled to a first control terminal, gates of the third thin film transistor and the fourth thin film transistor are coupled to a second control terminal, and gates of the second thin film transistor and the sixth thin film transistor are coupled to a third control terminal.

The present disclosure further provides an array substrate including a first data line lead and a second data line lead, a first data line to a sixth data line, and the demultiplexer described above, the first control terminal to the third control terminal are configured to be a first control gate line to a third control gate line which are arranged in parallel; the first thin film transistor to the third thin film transistor are located on a side of the demultiplexer proximal to the first control gate line and distal from the third control gate line, and the fourth thin film transistor to the sixth thin film transistor are located on a side of the demultiplexer proximal to the third control gate line and distal from the first control gate line; the first input terminal is coupled to the first data line lead; the second input terminal is coupled to the second data line lead; the drains of the first thin film transistor to the sixth thin film transistor serving as the first output terminal to the sixth output terminal are configured such that the drains of the first thin film transistor to the third thin film transistor are coupled to the first data line, the third data line and fifth data line, respectively, the drains of the fourth thin film transistor to the sixth thin film transistor are coupled to the second data line, the fourth data line and the sixth data line, respectively.

In some implementations, the first input terminal and the first data line lead are formed as a whole, and the second input terminal and the second data line lead are formed as a whole.

In some implementations, the first data line lead and the second data line lead are located on a side of the array substrate proximal to the first control gate line and distal from the third control gate line; the first data line to the sixth data line are located on a side of the array substrate proximal to the third control gate line and distal from the first control gate line.

In some implementations, the gates of the first thin film transistor to the sixth thin film transistor are located in a different layer from the first control gate line to the third control gate line; the sources and drains of the first thin film transistor to the sixth thin film transistor, the first data line to the sixth data line, the first data line lead and the second data line lead are located in a same layer as the first control gate line to the third control gate line.

In some implementations, the demultiplexer further includes a first gate connection part to a sixth gate connection part, a lead connection part, a first data line connection part, a third data line connection part and a fifth data line connection part, the gates of the first thin film transistor to the third thin film transistor are respectively coupled to the first control gate line, the third control gate line and the second control gate line through the first gate connection part to the third gate connection part; the gates of the fourth thin film transistor to the sixth thin film transistor are respectively coupled to the second control gate line, the first control gate line and the third control gate line through the fourth gate connection part to the sixth gate connection part; the lead connection part is configured to couple the second data line lead to the sources of the fourth thin film transistor to the sixth thin film transistors; the first data line connection part, the third data line connection part and the fifth data line connection part are configured to couple the first data line, the third data line and the fifth data line to the drains of the first thin film transistor to the third thin film transistors, respectively.

In some implementations, the lead connection part includes a first lead connection part and a second lead connection part, the first lead connection part is arranged in a different layer from the first control gate line to the third control gate line, and the first lead connection part is respectively coupled to the second data line lead and the second lead connection part; the second lead connection part is coupled to the sources of the fourth thin film transistor to the sixth thin film transistor, and the second lead connection part is arranged in a same layer as the first control gate line to the third control gate line.

In some implementations, the gates of the first thin film transistor to the sixth thin film transistor are arranged in a same layer as the first gate connection part to the sixth gate connection part.

In some implementations, the first data line connection part is coupled to the first data line and the drain of the first thin film transistor, and is arranged in a different layer from the first control gate line to the third control gate line; the third data line connection part includes a first branch part, a second branch part and a third branch part, the second branch part is coupled between the first branch part and the third branch part, the first branch part is arranged in a different layer from the third data line, is arranged to intersect with the fourth data line, and is coupled with the third data line and the second branch part; the third branch part intersects with the first control gate line to the third control gate line, is arranged in a different layer from the first control gate line to the third control gate line, and is coupled to the second branch part and the drain of the second thin film transistor; the fifth data line connection part is coupled to the fifth data line and the drain of the third thin film transistor, is arranged in a different layer from the first control gate line to the third control gate line, and intersects with the first control gate line to the third control gate line.

In some implementations, the gates of the first thin film transistor to the sixth thin film transistor are arranged in a same layer as the first control gate line to the third control gate line, and the sources and drains of the first thin film transistor to the sixth thin film transistor, the first data line to the sixth data line, and the first data line lead and the second data line lead are arranged in a different layer from the first control gate line to the third control gate line.

In some implementations, the gates of the first thin film transistor to the sixth thin film transistor are arranged in a different layer from the first gate connection part to the sixth gate connection part.

In some implementations, the first thin film transistor to the third thin film transistor are sequentially arranged along a direction in which the first control gate line to the third control gate lines extend, the fourth thin film transistor to the sixth thin film transistor are sequentially arranged along a direction in which the first control gate line to the third control gate line extend, and the first data line to the sixth data line are sequentially arranged along a direction in which the first control gate line to the third control gate line extend.

In some implementations, a sum of width-to-length ratios of channels of the first thin film transistor to the third thin film transistor is greater than 10, and a sum of width-to-length ratios of channels of the fourth thin film transistor to the sixth thin film transistor is greater than 10.

In some implementations, the source of the first thin film transistor and the source of the second thin film transistor are a first common source shared by the first thin film transistor and the second thin film transistor; the source of the fourth thin film transistor and the source of the fifth thin film transistor are a second common source shared by the fourth thin film transistor and the fifth thin film transistor.

In some implementations, the array substrate further includes a base substrate, a first insulating layer and a second insulating layer, active layers of the first thin film transistor to the sixth thin film transistor are arranged on the base substrate; the first insulating layer is arranged on the base substrate and above the active layers of the first thin film transistor to the sixth thin film transistor; the gates of the first thin film transistor to the sixth thin film transistor are arranged on the first insulating layer; the second insulating layer is arranged on the first insulating layer and above the gates of the first thin film transistor to the sixth thin film transistor; the sources and drains of the first thin film transistor to the sixth thin film transistor, the first control gate line to the third control gate line, the first data line lead and the second data line lead, and the first data line to the sixth data line are arranged on the second insulating layer.

In some implementations, the array substrate further includes a base substrate, a first insulating layer and a second insulating layer, the gates of the first thin film transistor to the sixth thin film transistor are arranged on the base substrate; the first insulating layer is arranged on the base substrate and above the gates of the first thin film transistor to the sixth thin film transistor; the active layers of the first thin film transistor to the sixth thin film transistor are arranged on the first insulating layer; the second insulating layer is arranged on the first insulating layer and above the active layers of the first thin film transistor to the sixth thin film transistor; the sources and drains of the first thin film transistor to the sixth thin film transistor, the first control gate line to the third control gate line, the first data line lead and the second data line lead, and the first data line to the sixth data line are arranged on the second insulating layer.

The present disclosure further provides a display device including the array substrate described above.

DETAILED DESCRIPTION

In order to enable those skilled in the art to better understand the technical solutions of the present disclosure, the demultiplexer, the array substrate and the display device provided by the present disclosure are described in detail below with reference to the accompanying drawings.

Figure 1:
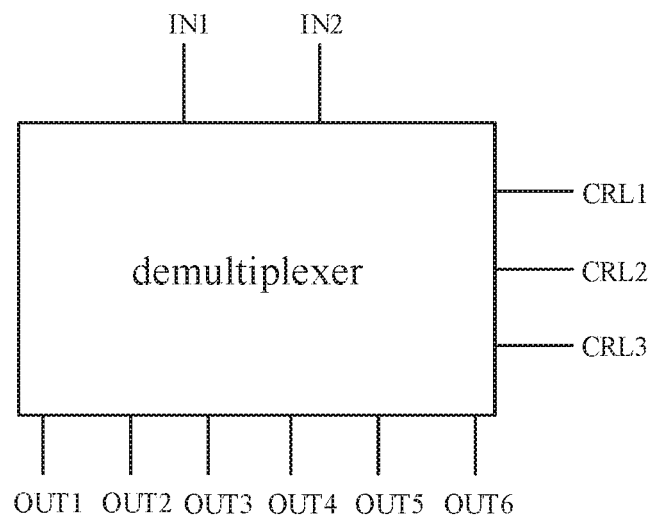
FIG. 1 is a schematic diagram of a demultiplexer according to an embodiment of the present disclosure.
Figure 2:
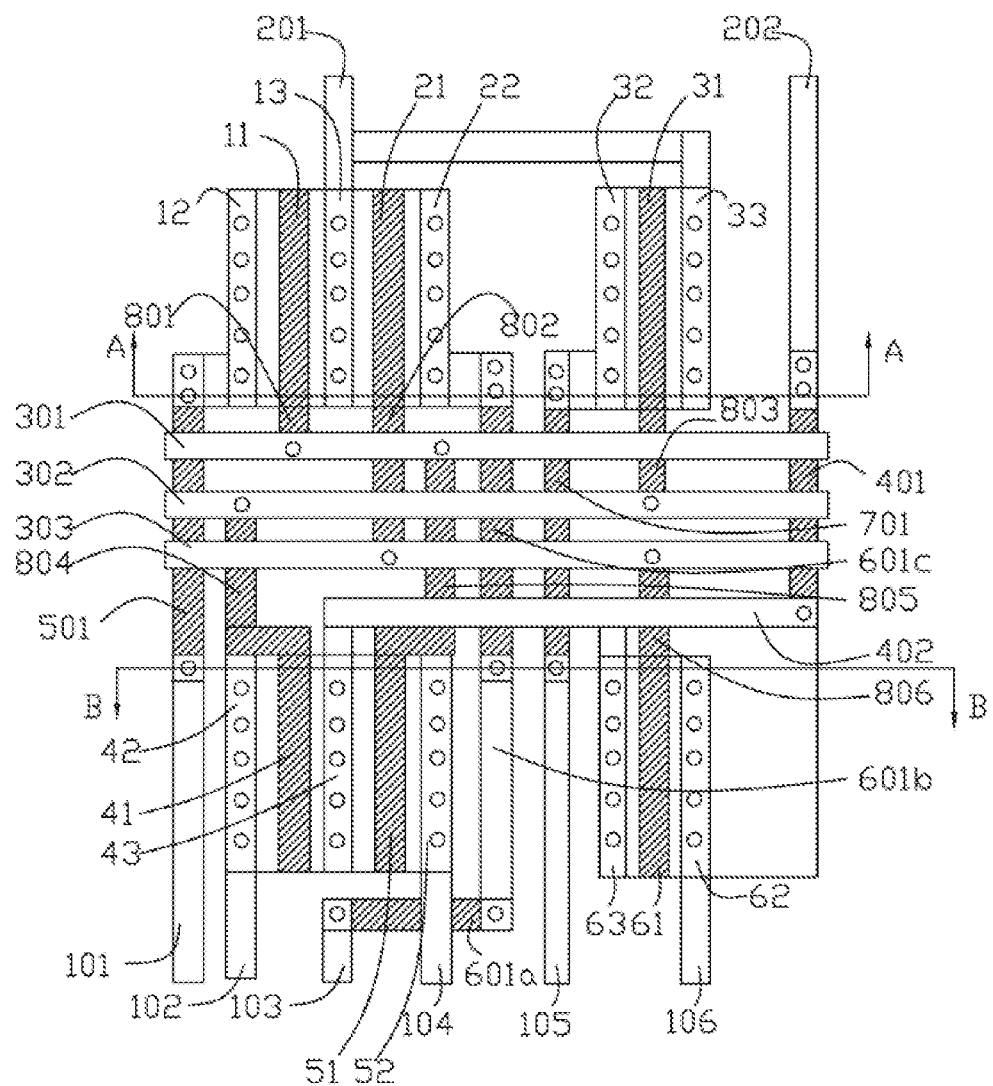
FIG. 2 is a top view of an array substrate according to an embodiment of the disclosure.

Referring to FIGS. 1 and 2, an embodiment of the present disclosure provides a demultiplexer including a first thin film transistor to a sixth thin film transistor. The first to third thin film transistor are located on a same side in the demultiplexer, and the fourth to sixth thin film transistors are located on another side opposite to the first to third thin film transistors in the demultiplexer. Sources 13, 13, 33 of the first to third thin film transistors are coupled together to form a first input terminal IN1 of the demultiplexer. Sources 43, 43, 63 of the fourth to sixth thin film transistors are coupled together to form a second input terminal IN2 of the demultiplexer. Drains 12, 22, 32, 42, 52, 62 of the first to sixth thin film transistors respectively serve as first to sixth output terminals OUT1 to OUT6 of the demultiplexer. Gates 11, 51 of the first and fifth thin film transistors are coupled to a first control terminal CRL1, gates 31, 41 of the third and fourth thin film transistors are coupled to a second control terminal CRL2, and gates 21, 61 of the second and sixth thin film transistors are coupled to a third control terminal CRL3.

Referring to FIG. 2, an embodiment of the present disclosure provides an array substrate including first and second data line leads 201 and 202 located in a non-display region, first to sixth data lines 101 to 106, and a demultiplexer as shown in FIG. 1.

As shown in FIGS. 1 and 2, in the array substrate provided in the embodiment of the present disclosure, the first to third control terminals CRL1 to CRL3 are configured as first to third control gate lines 301 to 303 arranged in parallel. The first to third thin film transistors are located at a side of the demultiplexer proximal to the first control gate line 301 and distal from the third control gate line 303, and are sequentially arranged along a direction in which the first to third control gate lines 301 to 303 extend. The fourth to sixth thin film transistors are located at a side of the demultiplexer proximal to the third control gate line 303 and distal from the first control gate line 301, and are sequentially arranged along a direction in which the first to third control gate lines 301 to 303 extend. The first input terminal IN1 is coupled to the first data line lead 201. The second input terminal IN2 is coupled to the second data line lead 202. The drains of the first to sixth thin film transistors serving as the first to sixth output terminals OUT1 to OUT6 are coupled to corresponding ones of the first to sixth data lines 101 to 106, respectively. The first to sixth data lines 101 to 106 are sequentially arranged along a direction in which the first to third control gate lines 301 to 303 extend.

Thus, a space for wiring of the demultiplexer, the data lines and the data line leads on a display panel can be saved, thereby facilitating completion of wiring on a display panel with a medium or small size.

In the embodiment of the present disclosure, the first input terminal IN1 and the first data line lead 201 are formed as a whole, and the second input terminal IN2 and the second data line lead 202 are formed as a whole.

In general, the data line lead is used to receive a display driving signal from a driving chip, the demultiplexer is used to decompose one signal into a plurality of signals, and the data line is used to transmit the signals decomposed by the demultiplexer to a subsequent device.

Connection manner of the thin film transistors, the data lines, the data line leads, and the control gate lines will be described in detail below. Specifically, as shown in FIG. 2, the sources 13, 13 and 33 of the first to third thin film transistors are coupled to the first data line lead 201. The sources 43, 43 and 63 of the fourth to sixth thin film transistors are coupled to the second data line lead 202.

In the embodiment of the present disclosure, the gates 11, 21 and 31 of the first to third thin film transistors are coupled to the first control gate line 301, the third control gate line 303, and the second control gate line 302, respectively. The gates 41, 51 and 61 of the fourth to sixth thin film transistors are coupled to the second control gate line 302, the first control gate line 301, and the third control gate line 303, respectively.

In the embodiment of the present disclosure, the drains 12, 22 and 32 of the first to third thin film transistors are coupled to the first data line 101, the third data line 103 and the fifth data line 105, respectively. The drains 42, 52 and 62 of the fourth to sixth thin film transistors are coupled to the second data line 102, the fourth data line 104 and the sixth data line 106, respectively.

In the embodiment of the disclosure, a color filter substrate to be assembled with the array substrate includes a plurality of pixel units, each pixel unit includes a red sub-pixel, a green sub-pixel and a blue sub-pixel, the first data line 101 and the fourth data line 104 respectively correspond to red sub-pixels of the first pixel unit and the second pixel unit adjacent to each other. The second data line 102 and the fifth data line 105 respectively correspond to green sub-pixels of the first pixel unit and the second pixel unit, and the third data line 103 and the sixth data line 106 correspond to blue sub-pixels of the first pixel unit and the second pixel unit, respectively.

Since the first data line 101, the second data line 102, and the third data line 103 correspond to the red sub-pixel, the green sub-pixel, and the blue sub-pixel of one pixel unit, and the fourth data line 104, the fifth data line 105, and the sixth data line 106 correspond to the red sub-pixel, the green sub-pixel, and the blue sub-pixel of another pixel unit adjacent to the one pixel unit, and two thin film transistors coupled to any two adjacent data lines are coupled to different data line leads, and thus a dot inversion mode and a column inversion mode of the array substrate can be realized, and an improved quality of display picture is favorably achieved, while reducing pins of the driving chip, not increasing an area of a peripheral circuit and reducing a power consumption of the circuit.

In the embodiment of the present disclosure, the first data line lead 201 and the second data line lead 202 are located on a side of the array substrate proximal to the first control gate line 301. The first to sixth data lines 101 to 106 are located on a side of the array substrate proximal to the third control gate line 303, that is, the data line leads and the data lines are located on opposite sides of the control gate line, respectively, which is more advantageous for saving a wiring space.

In the embodiment of the present disclosure, the gates of the first to sixth thin film transistors are arranged in a different layer from the first to third control gate lines 301 to 303, and are arranged in a different layer from sources and drains (not shown) of the thin film transistors in a display region. The sources and drains of the first to sixth thin film transistors, the first to sixth data lines 101 to 106, and the first and second data line leads 201 and 202 are arranged in a same layer as the first to third control gate lines 301 to 303. The first to third control gate lines 301 to 303 are arranged in a same layer as sources and drains of thin film transistors (not shown) in the display region.

In the embodiment of the present disclosure, the demultiplexer further includes first to sixth gate connection parts 801 to 806, a lead connection part, and three data line connection parts. The gates 11, 21 and 31 of the first to third thin film transistors are coupled to the first control gate line 301, the third control gate line 303, and the second control gate line 302 through the first to third gate connection parts 801 to 803, respectively. The gates 41, 51 and 61 of the fourth to sixth thin film transistors are coupled to the second control gate line 302, the first control gate line 301, and the third control gate line 303 through the fourth to sixth gate connection parts 804 to 806, respectively.

Specifically, the gate 11 of the first thin film transistor is coupled to the first control gate line 301 through the first gate connection part 801, and the first gate connection part 801 is coupled to the first control gate line 301 through a via hole. The gate 21 of the second thin film transistor is coupled to the third control gate line 303 through the second gate connection part 802, and the second gate connection part 802 is coupled to the third control gate line 303 through a via hole. The gate 31 of the third thin film transistor is coupled to the second control gate line 302 through the third gate connection part 803, and the third gate connection part 803 is coupled to the second control gate line 302 through a via hole. The gate 41 of the fourth thin film transistor is coupled to the second control gate line 302 through the fourth gate connection part 804, and the fourth gate connection part 804 is coupled to the second control gate line 302 through a via hole. The gate 51 of the fifth thin film transistor is coupled to the first control gate line 301 through the fifth gate connection part 805, and the fifth gate connection part 805 is coupled to the first control gate line 301 through a via hole. The gate 61 of the sixth thin film transistor is coupled to the third control gate line 303 through the sixth gate connection part 806, and the sixth gate connection part 806 is coupled to the third control gate line 303 through a via hole.

In the embodiment of the present disclosure, the lead connection part is configured to couple the second data line lead 202 with the sources 43, 43 and 63 of the fourth to sixth thin film transistors. Specifically, the lead connection part includes a first lead connection part 401 and a second lead connection part 402. The first lead connection part 401 is arranged in a different layer from the first to third control gate lines 301 to 303, and the first lead connection part 401 is coupled to the second data line lead 202 and the second lead connection part 402, respectively. The second lead connection part 402 is coupled to the sources 43, 43 and 63 of the fourth to sixth thin film transistors, and is arranged in a same layer as the first to third control gate lines 301 to 303. In this way, connections between the data line leads and the sources of the thin film transistors are achieved.

The three data line connection parts are configured to couple the first data line 101, the third data line 103, and the fifth data line 105 to the drains 12, 22 and 32 of the first to third thin film transistors, respectively. Specifically, in the embodiment of the present disclosure, the three data line connection parts are a first data line connection part 501, a third data line connection part and a fifth data line connection part 701, respectively, the first data line connection part 501 is coupled to the first data line 101 and the drain 12 of the first thin film transistor, respectively, and the first data line connection part 501 is arranged in a different layer from the first control gate line 301 to the third control gate line 303. The third data line connection part includes a first branch part 601a, a second branch part 601b, and a third branch part 601c, the second branch part 601b is coupled between the first branch part 601a and the third branch part 601c, the first branch part 601a is arranged in a different layer from the third data line 103 and intersects with the fourth data line 104, and the first branch part 601a is coupled to the third data line 103 and the second branch part 601b, respectively. The third branch part 601c intersects with the first to third control gate lines 301 to 303 and is arranged in a different layer from the first to third control gate lines 301 to 303, and is coupled to the second branch part 601b and the drain 22 of the second thin film transistor, respectively. The fifth data line connection part 701 is coupled to the fifth data line 105 and the drain 32 of the third thin film transistor, respectively, and the fifth data line connection part 701 intersects with the first to third control gate lines 301 to 303 and is arranged in a different layer from the first to third control gate lines 301 to 303. In this way, connections between the data lines and the drains of the thin film transistors can be achieved.

Figure 3A:
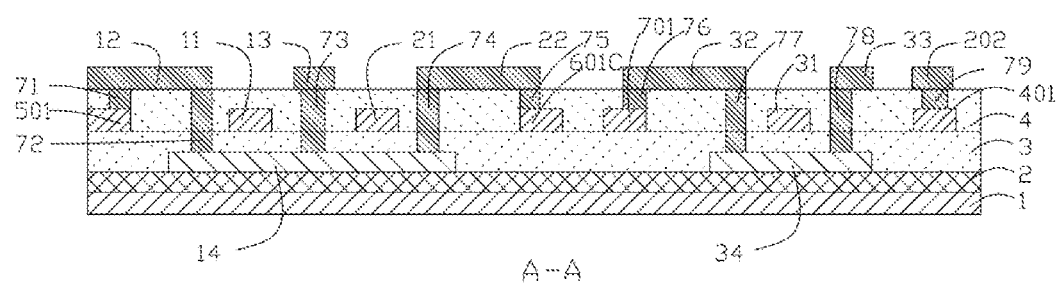
FIG. 3a is a cross-sectional view of the array substrate in FIG. 2 taken along line A-A, according to an embodiment of the present disclosure.
Figure 3B:
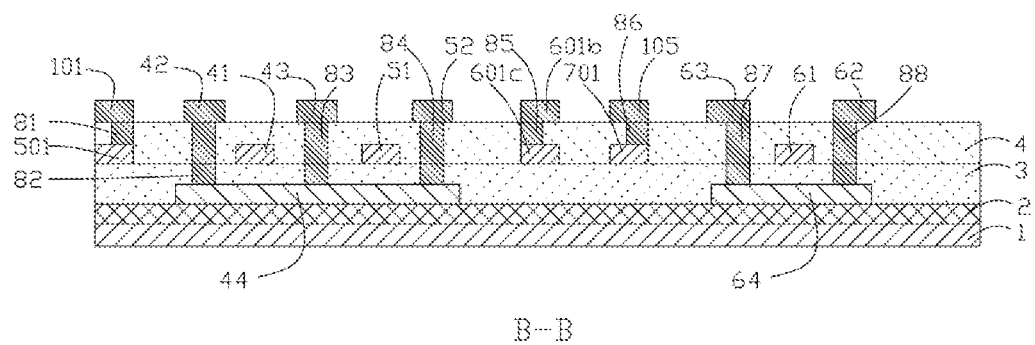
FIG. 3b is a cross-sectional view of the array substrate in FIG. 2 taken along line B-B, according to an embodiment of the present disclosure.

As shown in FIGS. 3a and 3b, in the embodiment of the present disclosure, the first lead connection part 401 is coupled to the second data line lead 202 through a via hole 79, and the first lead connection part 401 is coupled to the second lead connection part 402 through a via hole (not shown in the figure). The first data line connection part 501 is coupled to the drain 12 of the first thin film transistor through a via hole 71, and the first data line connection part 501 is coupled to the first data line 101 through a via hole 81. The drain 12 of the first thin film transistor is coupled to a first active layer 14 through a via hole 72, the source 13 of the first thin film transistor is coupled to the first active layer 14 through a via hole 73. The first branch part 601a is coupled to the third data line 103 through a via hole (not shown), and the first branch part 601a is coupled to the second branch part 601b through a via hole (not shown). The third branch part 601c is coupled to the second branch part 601b through a via hole 85, and the third branch part 601c is coupled to the drain 22 of the second thin film transistor through a via hole 75, and the drain 22 of the second thin film transistor is coupled to the first active layer 14 through a via hole 74. The fifth data line connection part 701 is coupled to the fifth data line 105 through a via hole 86, and the fifth data line connection part 701 is coupled to the drain 32 of the third thin film transistor through a via hole 76, the drain 32 of the third thin film transistor is coupled to a second active layer 34 through a via hole 77, and the source 33 of the third thin film transistor is coupled to the second active layer 34 through a via hole 78.

The drain 42 of the fourth thin film transistor is coupled to a third active layer 44 through a via hole 82, the source 43 of the fourth thin film transistor is coupled to the third active layer 44 through a via hole 83, and the drain 52 of the fifth thin film transistor is coupled to the third active layer 44 through a via hole 84. The drain 62 of the sixth thin film transistor is coupled to a fourth active layer 64 through a via hole 88, and the source 63 of the sixth thin film transistor is coupled to the fourth active layer 64 through a via hole 87.

The gates of the first to sixth thin film transistors are arranged in a different layer from the first to third control gate lines 301 to 303. Furthermore, the first to sixth gate connection parts 801 to 806 included in the demultiplexer are arranged in a same layer as the gates of the first to sixth thin film transistors.

In some implementations, the gates of the first to sixth thin film transistors are arranged in a same layer as the first to third control gate lines, and the sources and drains of the first to sixth thin film transistors, the first to sixth data lines, and the first and second data line leads are arranged in a different layer from the first to third control gate lines.

In this case, the demultiplexer further includes the first to sixth gate connection parts, the lead connection part, and the three data line connection parts, similar to the previous embodiment. The first gate connection part 801 to the sixth gate connection part 806 are arranged in a different layer from the gates of the first thin film transistor to the sixth thin film transistor. Structures and functions of the lead connection part and the three data line connection parts are similar to those of the previous embodiment, and since detailed descriptions thereof have been made in the previous embodiment, the detailed descriptions are omitted here.

In some implementations, a sum of width-to-length ratios of channels of the first to third thin film transistors is greater than 10, a sum of width-length ratios of channels of the four to sixth thin film transistors is greater than 10. It has been found through experiments that, by setting the sum of the width-to-length ratios of channels of the thin film transistors to be greater than 10, a charging current can be increased, thereby improving the charging efficiency. Here, the width-length ratio of the channel refers to a ratio of a width to a length of the channel, the width of the channel is a length of an active layer of the thin film transistor in an extending direction of the drain or the source, and the length of the channel is a distance between the source and the drain of the thin film transistor.

The active layer of the thin film transistor may include amorphous silicon, low temperature polysilicon, or an oxide semiconductor.

In some implementations, the source of the first thin film transistor and the source of the second thin film transistor are a first common source 13 shared by the first thin film transistor and the second thin film transistor, the first common source 13 is electrically coupled to the first active layer 14 through at least one via hole 73. The source of the fourth thin film transistor and the source of the fifth thin film transistor are a second common source 43 shared by the fourth thin film transistor and the fifth thin film transistor, and the second common source 43 is electrically coupled to the third active layer 44 through at least one via hole 83. Thus, the width-to-length ratio of channel of the thin film transistor can be increased.

In the embodiment of the present disclosure, the array substrate further includes a base substrate 1, a buffer layer 2, a first insulating layer 3, and a second insulating layer 4. In some implementations, the array substrate is of a top gate structure. As shown in FIGS. 3a and 3b, the buffer layer 2 is provided on the base substrate 1. Active layers of the first to sixth thin film transistors are arranged on the buffer layer 2. The first insulating layer 3 is arranged on the buffer layer 2 and above the active layers of the first to sixth thin film transistors. The gates of the first to sixth thin film transistors are arranged on the first insulating layer 3. The second insulating layer 4 is arranged on the first insulating layer 3 and above the gates of the first to sixth thin film transistors. The sources and drains of the first to sixth thin film transistors, the first to third control gate lines, the data line leads, and the data lines are arranged on the second insulating layer 4.

Figure 4A:
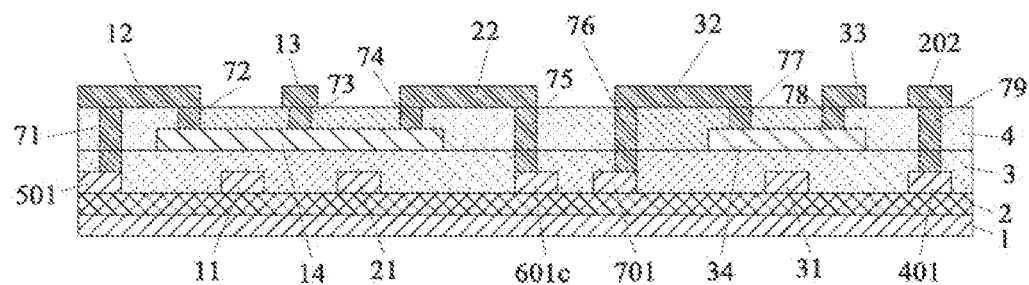
FIG. 4a is a cross-sectional view of the array substrate in FIG. 2 taken along line A-A, according to another embodiment of the present disclosure.
Figure 4B:
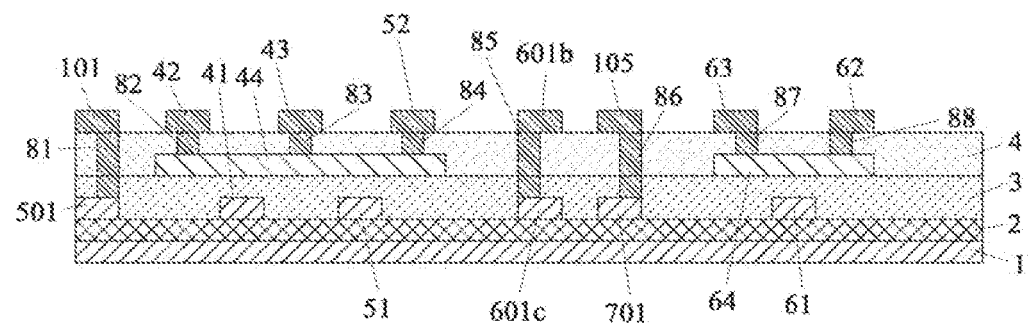
FIG. 4b is a cross-sectional view of the array substrate in FIG. 2 taken along line B-B, according to another embodiment of the present disclosure.

In some implementations, the array substrate is of a bottom gate structure. As shown in FIGS. 4a and 4b, the gates of the first to sixth thin film transistors are arranged on the base substrate. The first insulating layer is arranged on the base substrate and above the gates of the first thin film transistor, the second thin film transistor, the third thin film transistor and the fourth thin film transistor. The active layers of the first to sixth thin film transistors are arranged on the first insulating layer. The second insulating layer is arranged on the first insulating layer and above the active layers of the first thin film transistor to the sixth thin film transistor. The sources and drains of the first to sixth thin film transistors, the first to third control gate lines, the data line leads, and the data lines are arranged on the second insulating layer.

In summary, according to the array substrate provided by the present disclosure, since the first to third thin film transistors of the demultiplexer are located on a side of the demultiplexer proximal to the first control gate line, and the fourth to sixth thin film transistors are located on a side of the demultiplexer proximal to the third control gate line, the wiring space of the demultiplexer, the data lines and the data line leads on the display panel can be saved, which is beneficial to completing the wiring on the display panel with a middle or small size.

The present disclosure further provides a display device including the above array substrate provided by the present disclosure.

In the display device provided by the present disclosure, the array substrate provided by the present disclosure is adopted, so that the wiring space of the demultiplexer, the data lines and the data line leads on the display panel can be saved, which is beneficial to completing the wiring on the display panel with a middle or small size.

It should be understood that, the foregoing embodiments are only exemplary embodiments used for explaining the principle of the present disclosure, but the present disclosure is not limited thereto. Various variations and modifications may be made by a person skilled in the art without departing from the spirit and essence of the present disclosure, and these variations and modifications also fall into the protection scope of the present disclosure.

The invention claimed is:

1. A demultiplexer, comprising a first thin film transistor to a sixth thin film transistor, wherein,
   the first thin film transistor to the third thin film transistor are located on a same side in the demultiplexer, and the fourth thin film transistor to the sixth thin film transistor are located on another side opposite to the first thin film transistor to the third thin film transistor in the demultiplexer;
   sources of the first thin film transistor to the third thin film transistor are coupled together to form a first input terminal of the demultiplexer;
   sources of the fourth thin film transistor to the sixth thin film transistor are coupled together to form a second input terminal of the demultiplexer;
   drains of the first thin film transistor to the sixth thin film transistor are respectively used as a first output terminal to a sixth output terminal of the demultiplexer;
   gates of the first thin film transistor and the fifth thin film transistor are coupled to a first control terminal, gates of the third thin film transistor and the fourth thin film transistor are coupled to a second control terminal, and gates of the second thin film transistor and the sixth thin film transistor are coupled to a third control terminal.

2. The demultiplexer of claim 1, wherein a sum of width-to-length ratios of channels of the first thin film transistor to the third thin film transistor is greater than 10, and a sum of width-to-length ratios of channels of the fourth thin film transistor to the sixth thin film transistor is greater than 10.

3. The demultiplexer of claim 1, wherein the source of the first thin film transistor and the source of the second thin film transistor are a first common source shared by the first thin film transistor and the second thin film transistor;
   the source of the fourth thin film transistor and the source of the fifth thin film transistor are a second common source shared by the fourth thin film transistor and the fifth thin film transistor.

4. An array substrate, including a first data line lead and a second data line lead, a first data line to a sixth data line, and the demultiplexer of claim 1, wherein,
   the first control terminal to the third control terminal are configured to be a first control gate line to a third control gate line which are arranged in parallel;
   the first thin film transistor to the third thin film transistor are located on a side of the demultiplexer proximal to the first control gate line and distal from the third control gate line, and the fourth thin film transistor to the sixth thin film transistor are located on a side of the demultiplexer proximal to the third control gate line and distal from the first control gate line;
   the first input terminal is coupled to the first data line lead;
   the second input terminal is coupled to the second data line lead;
   the drains of the first thin film transistor to the sixth thin film transistor serving as the first output terminal to the sixth output terminal are configured such that the drains of the first thin film transistor to the third thin film transistor are coupled to the first data line, the third data line and fifth data line, respectively, the drains of the fourth thin film transistor to the sixth thin film transistor are coupled to the second data line, the fourth data line and the sixth data line, respectively.

5. The array substrate of claim 4, wherein the first input terminal and the first data line lead are formed as a whole, and the second input terminal and the second data line lead are formed as a whole.

6. The array substrate of claim 5, wherein the first data line lead and the second data line lead are located on a side of the array substrate proximal to the first control gate line and distal from the third control gate line; the first data line to the sixth data line are located on a side of the array substrate proximal to the third control gate line and distal from the first control gate line, and
the gates of the first thin film transistor to the sixth thin film transistor are located in a different layer from the first control gate line to the third control gate line: the sources and drains of the first thin film transistor to the sixth thin film transistor, the first data line to the sixth data line, the first data line lead and the second data line lead are located in a same layer as the first control gate line to the third control gate line.

7. The array substrate of claim 5, wherein the demultiplexer further comprises a first gate connection part to a sixth gate connection part, a lead connection part, a first data line connection part, a third data line connection part and a fifth data line connection part, wherein,
the gates of the first thin film transistor to the third thin film transistor are respectively coupled to the first control gate line, the third control gate line and the second control gate line through the first gate connection part to the third gate connection part; the gates of the fourth thin film transistor to the sixth thin film transistor are respectively coupled to the second control gate line, the first control gate line and the third control gate line through the fourth gate connection part to the sixth gate connection part;
the lead connection part is configured to couple the second data line lead to the sources of the fourth thin film transistor to the sixth thin film transistors;
the first data line connection part, the third data line connection part and the fifth data line connection part are configured to couple the first data line, the third data line and the fifth data line to the drains of the first thin film transistor to the third thin film transistors, respectively.

8. The array substrate of claim 7, wherein the lead connection part include a first lead connection part and a second lead connection part, the first lead connection part is arranged in a different layer from the first control gate line to the third control gate line, and the first lead connection part is respectively coupled to the second data line lead and the second lead connection part; the second lead connection part is coupled to the sources of the fourth thin film transistor to the sixth thin film transistor, and the second lead connection part is arranged in a same layer as the first control gate line to the third control gate line.

9. The array substrate of claim 7, wherein the gates of the first thin film transistor to the sixth thin film transistor are arranged in a same layer as the first gate connection part to the sixth gate connection part.

10. The array substrate of claim 7, wherein,
the first data line connection part is coupled to the first data line and the drain of the first thin film transistor, and is arranged in a different layer from the first control gate line to the third control gate line;
the third data line connection part includes a first branch part, a second branch part and a third branch part, the second branch part is coupled between the first branch part and the third branch part, wherein the first branch part is arranged in a different layer from the third data line, is arranged to intersect with the fourth data line, and is coupled with the third data line and the second branch part; the third branch part intersects with the first control gate line to the third control gate line, is arranged in a different layer from the first control gate line to the third control gate line, and is coupled to the second branch part and the drain of the second thin film transistor;
the fifth data line connection part is coupled to the fifth data line and the drain of the third thin film transistor, is arranged in a different layer from the first control gate line to the third control gate line, and intersects with the first control gate line to the third control gate line.

11. The array substrate of claim 5, wherein the gates of the first thin film transistor to the sixth thin film transistor are arranged in a same layer as the first control gate line to the third control gate line, and the sources and drains of the first thin film transistor to the sixth thin film transistor, the first data line to the sixth data line, and the first data line lead and the second data line lead are arranged in a different layer from the first control gate line to the third control gate line.

12. The array substrate of claim 11, wherein the demultiplexer further comprises a first gate connection part to a sixth gate connection part, a lead connection part and a first data line connection part, a third data line connection part and a fifth data line connection part, wherein,
the gates of the first thin film transistor to the third thin film transistor are respectively coupled to the first control gate line, the third control gate line and the second control gate line through the first gate connection part to the third gate connection part; the gates of the fourth thin film transistor to the sixth thin film transistor are respectively coupled to the second control gate line, the first control gate line and the third control gate line through the fourth gate connection part to the sixth gate connection part;
the lead connection part is configured to couple the second data line lead to the sources of the fourth thin film transistor to the sixth thin film transistor;
the first data line connection part, the third data line connection part and the fifth data line connection part are configured to couple the first data line, the third data line and fifth data line to the drains of the first thin film transistor to the third thin film transistor, respectively.

13. The array substrate of claim 12, wherein the lead connection part comprises a first lead connection part and a second lead connection part, the first lead connection part is arranged in a different layer from the first control gate line to the third control gate line, and the first lead connection part is respectively coupled to the second data line lead and the second lead connection part; the second lead connection part is coupled to the sources of the fourth thin film transistor to the sixth thin film transistor, and the second lead connection part and the first control gate line to the third control gate line are arranged in a same layer.

14. The array substrate of claim 12, wherein the gates of the first thin film transistor to the sixth thin film transistor are arranged in a different layer from the first gate connection part to the sixth gate connection part.

15. The array substrate of claim 12, wherein,
the first data line connection part is coupled to the first data line and the drain of the first thin film transistor, and is arranged in a different layer from the first control gate line to the third control gate line;
the third data line connection part comprises a first branch part, a second branch part and a third branch part, the second branch part is coupled between the first branch part and the third branch part, wherein the first branch part is arranged in a different layer from the third data line, is arranged to intersect with the fourth data line, and is coupled to the third data line and the second branch part; the third branch part intersects with the first control gate line to the third control gate line, is arranged in a different layer from the first control gate line to the third control gate line, and is coupled to the second branch part and the drain of the second thin film transistor;

the fifth data line connection part is coupled to the fifth data line and the drain of the third thin film transistor, is arranged in a different layer from the first control gate line to the third control gate line, and intersects with the first control gate line to the third control gate line.

16. The array substrate of claim 4, wherein,
the first thin film transistor to the third thin film transistor are sequentially arranged along a direction in which the first control gate line to the third control gate lines extend,
the fourth thin film transistor to the sixth thin film transistor are sequentially arranged along a direction in which the first control gate line to the third control gate line extend, and
the first data line to the sixth data line are sequentially arranged along a direction in which the first control gate line to the third control gate line extend.

17. The array substrate according to claim 4, wherein the source of the first thin film transistor and the source of the second thin film transistor are a first common source shared by the first thin film transistor and the second thin film transistor;
the source of the fourth thin film transistor and the source of the fifth thin film transistor are a second common source shared by the fourth thin film transistor and the fifth thin film transistor.

18. The array substrate of claim 17, further comprising a base substrate, a first insulating layer and a second insulating layer, wherein, active layers of the first thin film transistor to the sixth thin film transistor are arranged on the base substrate;
the first insulating layer is arranged on the base substrate and above the active layers of the first thin film transistor to the sixth thin film transistor;
the gates of the first thin film transistor to the sixth thin film transistor are arranged on the first insulating layer;
the second insulating layer is arranged on the first insulating layer and above the gates of the first thin film transistor to the sixth thin film transistor;
the sources and drains of the first thin film transistor to the sixth thin film transistor, the first control gate line to the third control gate line, the first data line lead and the second data line lead, and the first data line to the sixth data line are arranged on the second insulating layer.

19. The array substrate of claim 17, further comprising a base substrate, a first insulating layer and a second insulating layer, wherein,
the gates of the first thin film transistor to the sixth thin film transistor are arranged on the base substrate;
the first insulating layer is arranged on the base substrate and above the gates of the first thin film transistor to the sixth thin film transistor;
the active layers of the first thin film transistor to the sixth thin film transistor are arranged on the first insulating layer;
the second insulating layer is arranged on the first insulating layer and above the active layers of the first thin film transistor to the sixth thin film transistor;
the sources and drains of the first thin film transistor to the sixth thin film transistor, the first control gate line to the third control gate line, the first data line lead and the second data line lead, and the first data line to the sixth data line are arranged on the second insulating layer.

20. A display device, comprising the array substrate of claim 4.

* * * * *